(12) United States Patent
Horimoto et al.

(10) Patent No.: US 9,029,204 B2
(45) Date of Patent: May 12, 2015

(54) METHOD FOR MANUFACTURING SEMICONDUCTOR DEVICE AND METHOD FOR MANUFACTURING MICROPHONE

(75) Inventors: Yasuhiro Horimoto, Kusatsu (JP); Yusuke Nakagawa, Kyoto (JP); Tadashi Inoue, Yasu (JP); Toshiyuki Takahashi, Otsu (JP)

(73) Assignee: OMRON Corporation, Kyoto (JP)

(*) Notice: Subject to any disclaimer, the term of this patent is extended or adjusted under 35 U.S.C. 154(b) by 0 days.

(21) Appl. No.: 14/000,780

(22) PCT Filed: Mar. 18, 2011

(86) PCT No.: PCT/JP2011/056586
§ 371 (c)(1),
(2), (4) Date: Oct. 30, 2013

(87) PCT Pub. No.: WO2012/114538
PCT Pub. Date: Aug. 30, 2012

(65) Prior Publication Data
US 2014/0045290 A1 Feb. 13, 2014

(30) Foreign Application Priority Data

Feb. 22, 2011 (JP) ................ 2011-035915

(51) Int. Cl.
*H01L 21/00* (2006.01)
*B81C 1/00* (2006.01)
*H01L 21/58* (2006.01)
*H01L 21/304* (2006.01)
*H04R 19/00* (2006.01)
*H04R 31/00* (2006.01)
*H01L 21/50* (2006.01)

(52) U.S. Cl.
CPC ............ *B81C 1/00261* (2013.01); *H01L 21/58* (2013.01); *H01L 21/304* (2013.01); *H04R 19/005* (2013.01); *H04R 31/00* (2013.01); *H01L 21/50* (2013.01); *H04R 2201/003* (2013.01)

(58) Field of Classification Search
CPC ....... H01L 21/58; H01L 21/60; H01L 21/702; H01L 21/71
See application file for complete search history.

(56) References Cited

U.S. PATENT DOCUMENTS

| | | | |
|---|---|---|---|
| 6,199,430 B1 | 3/2001 | Kano et al. | |
| 6,240,782 B1 | 6/2001 | Kato et al. | |
| 2004/0203188 A1* | 10/2004 | Draney et al. | ............... 438/106 |

FOREIGN PATENT DOCUMENTS

| | | | |
|---|---|---|---|
| JP | 11-218543 A | 8/1999 | |
| JP | 2005-043159 A | 2/2005 | |
| JP | 2006-311106 A | 11/2006 | |
| JP | 2007-178221 A | 7/2007 | |
| JP | 2007-279056 A | 10/2007 | |

OTHER PUBLICATIONS

International Search Report for Application No. PCT/JP11/56586, issued Jun. 14, 2011.
Japanese Office Action for Application No. 2011-035915, issued Oct. 22, 2012. (3 pages).

* cited by examiner

*Primary Examiner* — Cheung Lee
(74) *Attorney, Agent, or Firm* — Nutter McClennen & Fish LLP; John J. Penny, Jr.

(57) ABSTRACT

A method for manufacturing a semiconductor device is provided, the method comprising: fabricating a semiconductor element on a semiconductor substrate; joining a surface of the semiconductor substrate to a support member, the surface being on a side where the semiconductor element is fabricated; and polishing a surface on an opposite side of the surface of the semiconductor substrate where the semiconductor element is fabricated and reducing a thickness of the semiconductor substrate, in a state where the semiconductor substrate and the support member are joined.

8 Claims, 15 Drawing Sheets

METHOD FOR MANUFACTURING SEMICONDUCTOR DEVICE AND METHOD FOR MANUFACTURING MICROPHONE

CROSS-REFERENCE TO RELATED APPLICATION(S)

This application claims the benefit of priority from Japanese Patent Application No. 2011-035915, filed on 22 Feb. 2011, and International Application No. PCT/JP2011/056586, filed on 18 Mar. 2011 and designating the United States, the entire contents of which is incorporated herein by reference for all purposes.

BACKGROUND

The present invention relates to a method for manufacturing a semiconductor device. The present invention also relates to a method for manufacturing a microphone having an acoustic sensor mounted in a package.

(General Microphone)

FIG. 1 is a cross-sectional view of a conventional microphone having a general structure. A microphone 11 has an acoustic sensor 15 and a signal processing circuit 17 mounted in a package formed from a cover 12 and a circuit board 13. The acoustic sensor 15 and the signal processing circuit 17 are mounted being arranged side by side on the upper surface of the circuit board 13. The signal processing circuit 17 is covered by sealing resin 21. The acoustic sensor 15 and the signal processing circuit 17 are electrically connected by a bonding wire 18, and the signal processing circuit 17 is further connected to a board wiring 14 of the circuit board 13 by a bonding wire 19.

Normally, the lower surface of the circuit board 13 is mounted on a printed wiring board, and is adhered to the printed wiring board. Accordingly, a sound introduction hole 20 for introducing acoustic vibration into the package is opened in the upper surface of the cover 12. The lower surface of the acoustic sensor 15 is bonded to the circuit board 13, and the lower surface of a back chamber 16 is blocked by the circuit board 13.

In a capacitance microphone, there is a correlation between the sensitivity of the microphone and the capacity of the back chamber, and the sensitivity of the microphone decreases as the capacity of the back chamber decreases. In the microphone 11, since the sound introduction hole 20 is provided to the cover 12, and the space between the acoustic sensor 15 and the circuit board 13 forms the back chamber 16, the capacity of the back chamber 16 cannot be increased, and it is difficult to improve the sensitivity of the microphone 11.

(Microphone of Patent Document 1)

A microphone disclosed in Patent Document 1 (JP 2007-178221 A) is shown in FIG. 2. In a microphone 31 of Patent Document 1, the signal processing circuit 17 is mounted on the upper surface of the circuit board 13. A spacer 32 is fixed to the upper surface of the circuit board 13, at a position adjacent to the signal processing circuit 17, and the acoustic sensor 15 is further mounted on the upper surface of the spacer 32. A vertically penetrating through-hole 33 is opened in the spacer 32. An electrode pad is provided to the lower surface of the acoustic sensor 15, and the acoustic sensor 15 is electrically connected to the circuit board 13 via the spacer 32. The sound introduction hole 20 is opened in the cover 12.

In the microphone 31, the through-hole 33 of the spacer 32 is continuous with the back chamber 16 of the acoustic sensor 15, and thus, the space below a diaphragm is widened. As a result, the capacity of the back chamber 16 of the acoustic sensor 15 can be substantially increased, and the sensitivity of the microphone 31 is improved.

However, according to such a structure, since the spacer 32 is mounted on the upper surface of the circuit board 13, and the acoustic sensor 15 is further mounted on the spacer 32, there is an inconvenience that the height of the microphone 31 is great.

As a method for reducing the height of such a microphone, there is conceivable a method for reducing the height of the acoustic sensor by polishing and thinning the substrate portion of the acoustic sensor in the manufacturing process of the acoustic sensor. However, in the manufacturing process of the acoustic sensor, a plurality of acoustic sensors is fabricated at one time on a wafer. Accordingly, if the substrate portion of the acoustic sensor is to be made thin, the wafer is to be polished and thinned during the manufacturing process of the acoustic sensor.

As the wafer, a thin wafer with a large diameter is usually used. Accordingly, if the wafer is polished and made even thinner, rigidity of the wafer is greatly reduced. As a result, the wafer may be cracked or chipped in the polishing process or a subsequent process, and a yield of the acoustic sensor may be reduced.

The present invention has been devised to solve the problems described above, and an object thereof is to provide a method for manufacturing a semiconductor device structured to have a semiconductor element mounted on a support member (for example, a microphone structured to have an acoustic sensor mounted on a support member), the method being capable of reducing the height of the semiconductor element, and thereby reducing the height of the semiconductor device.

SUMMARY

A method for manufacturing a semiconductor device according to at least one embodiment of the present invention comprising: fabricating a semiconductor element on a semiconductor substrate; joining a surface of the semiconductor substrate to a support member, the surface being on a side where the semiconductor element is fabricated; and polishing a surface on an opposite side of the surface of the semiconductor substrate where the semiconductor element is fabricated and reducing a thickness of the semiconductor substrate, in a state where the semiconductor substrate and the support member are joined.

DETAILED DESCRIPTION

Hereinafter, preferred embodiments of the present invention will be described with reference to the accompanying drawings. In the following embodiments, a microphone is described as an example of a semiconductor device. In this microphone, an acoustic sensor is used as a semiconductor element. However, the present invention is not restricted to the following embodiments, and various modifications in design can be made without departing from the scope of the present invention.

First Embodiment

Figure 3:
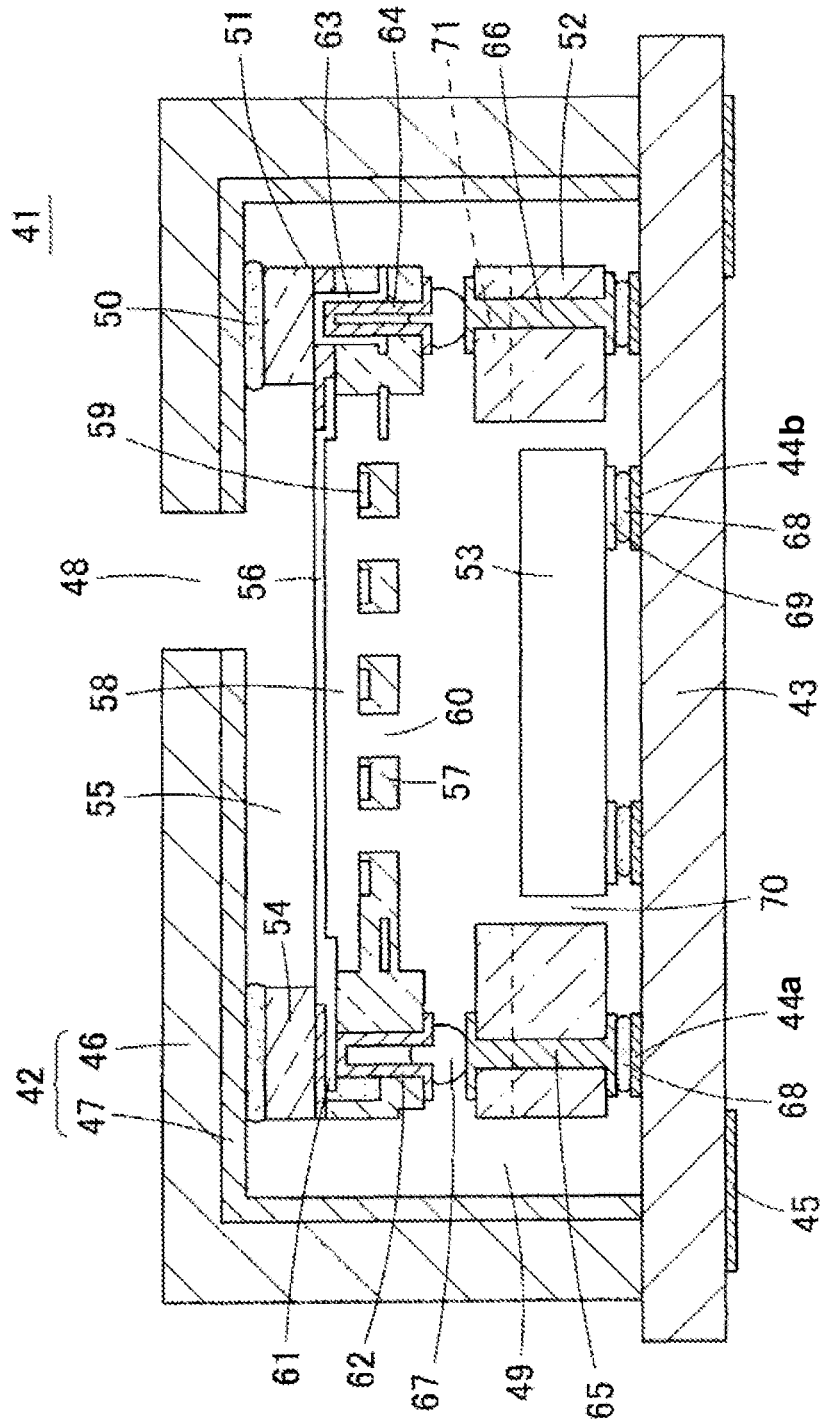
FIG. 3 is a cross-sectional view showing a structure of a microphone according to a first embodiment of the present invention.
Figure 4:
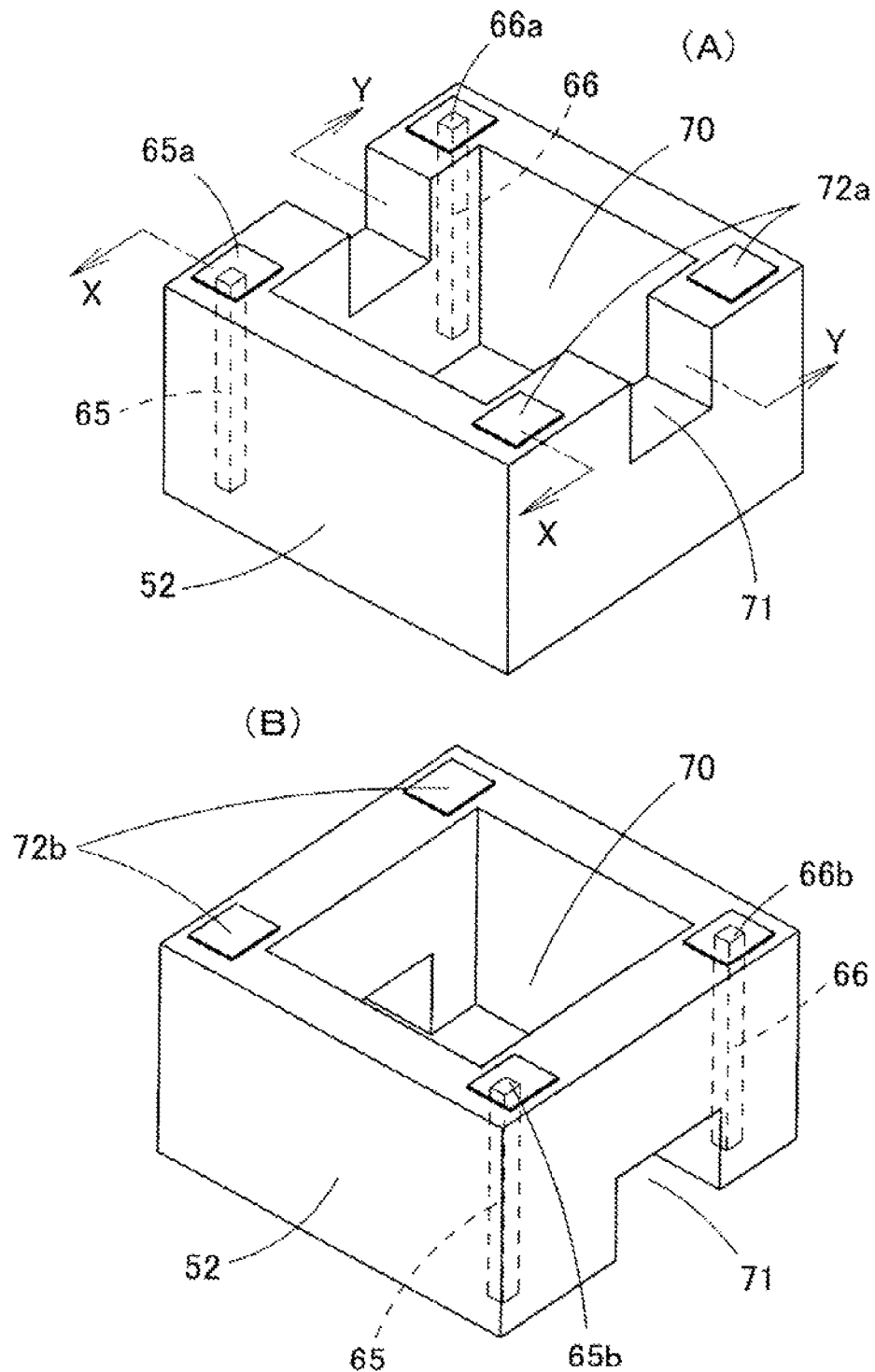
FIG. 4(A) is a perspective view of an interposer used for the microphone of the first embodiment.
FIG. 4(B) is a perspective view of the interposer where the interposer is vertically inverted.
Figure 5:
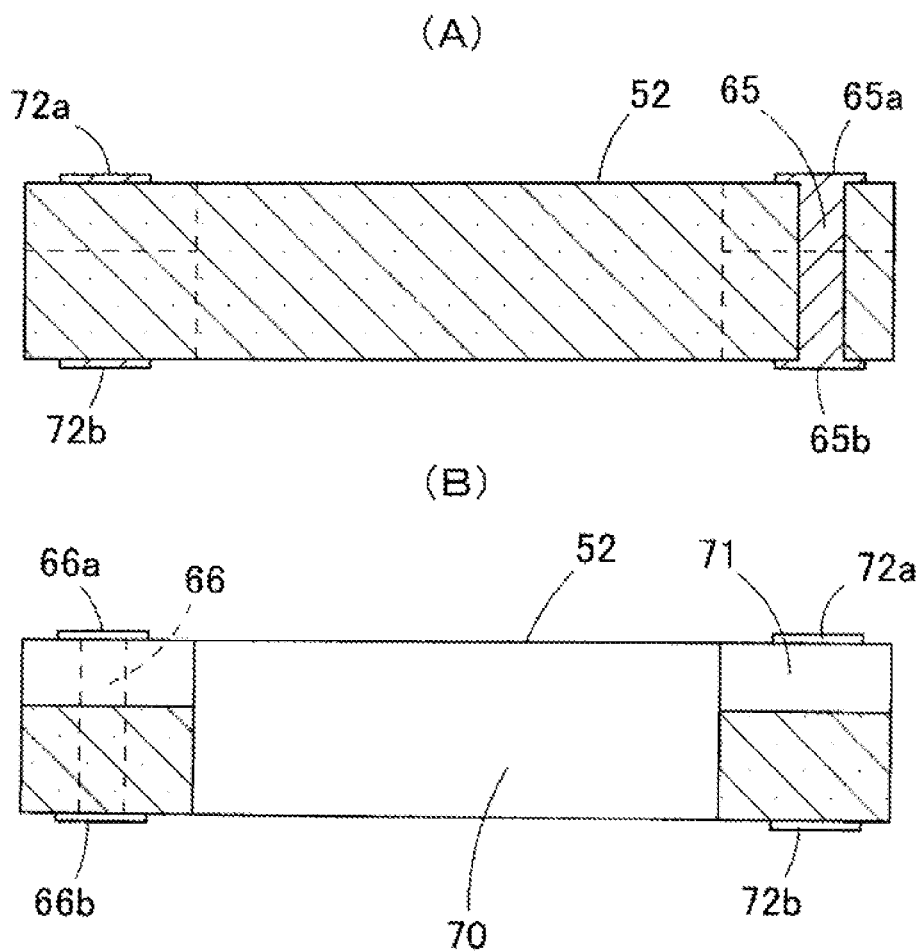
FIG. 5(A) is a cross-sectional view taken along line X-X in FIG. 4(A).
FIG. 5(B) is a cross-sectional view taken along line Y-Y in FIG. 4(A).
Figure 6:
FIGS. 6(A) to 6(F) are cross-sectional views for describing a manufacturing process of the interposer.
Figure 6:
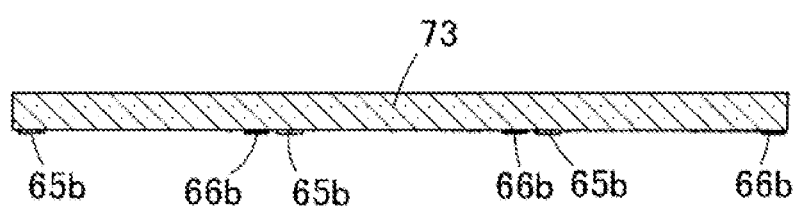
Figure 6:
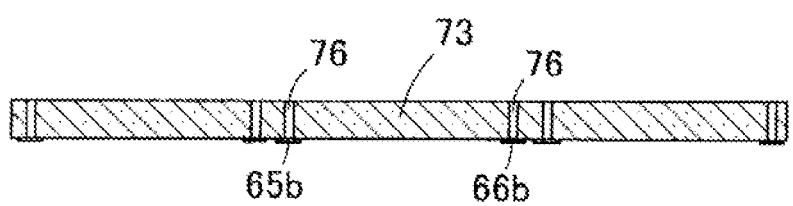
Figure 6:
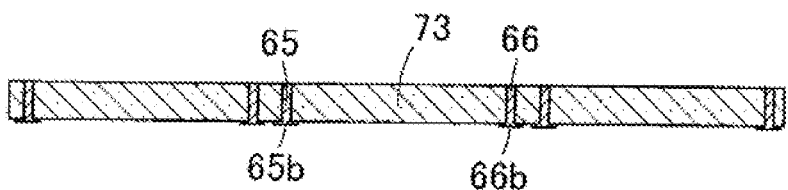
Figure 6:
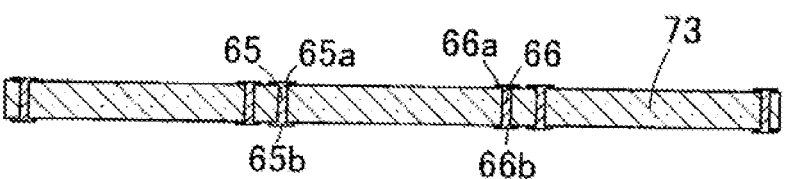
Figure 6:
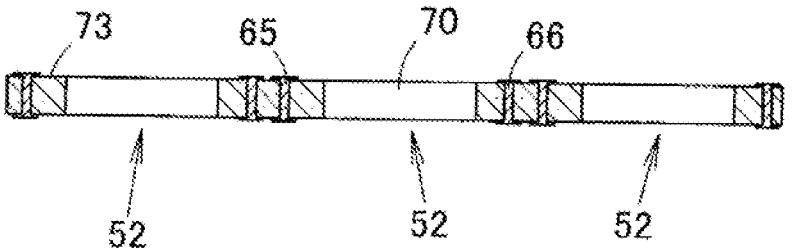

Hereinafter, a microphone (i.e., a semiconductor device) according to a first embodiment of the present invention will be described with reference to FIGS. 3 to 5(B). FIG. 3 is a cross-sectional view showing a structure of a microphone 41 according to the first embodiment. FIG. 4(A) is a perspective view of an interposer 52 (i.e., a support member) used for the microphone 41, and FIG. 4(B) is a perspective view of the interposer 52 where the interposer 52 is vertically inverted. FIGS. 5(A) and 5(B) are cross-sectional views of the interposer 52, and FIG. 5(A) shows a cross-section along line X-X in FIG. 4(A), and FIG. 5(B) shows a cross-section along line Y-Y in FIG. 4(A).

In the microphone 41, a package is formed by a cover 42 and a circuit board 43. An acoustic sensor 51 (i.e., a semiconductor element), the interposer 52, and a signal processing circuit 53 are accommodated inside the package.

A plurality of upper surface electrode pads 44a and 44b for joining the interposer 52 and the signal processing circuit 53 are provided on the upper surface of the circuit board 43 forming a part of the package. A plurality of lower surface electrode pads 45 for connecting the microphone 41 to a printed wiring board or the like at the time of mounting the microphone 41 on the printed wiring board or the like are provided on the lower surface of the circuit board 43. The cover 42 is box-shaped with its lower surface opened, and an electromagnetic shield film 47, which is a metal-coated film, is formed on the inner surface of a cover main body 46 formed of an insulating material (for example, plastic). Also, at least one sound introduction hole 48 is opened in the cover 42 to introduce acoustic vibration into the package.

Note that the cover main body 46 may be made of metal, and in this case, the cover main body 46 serves as an electromagnetic shied. Thus, the electromagnetic shield film 47 is not required to be separately provided.

The acoustic sensor 51 is a capacitance element fabricated using a MEMS technique. As shown in FIG. 3, the whole of the acoustic sensor 51 is held by a silicon substrate 54 (a semiconductor substrate). A front chamber 55 is opened in the silicon substrate 54 in a vertically penetrating manner. A thin-film diaphragm 56 is provided on the lower surface of the silicon substrate 54 so as to cover the opening on the lower surface of the front chamber 55. The diaphragm 56 is formed of conductive polysilicon. Accordingly, the diaphragm 56 itself is a movable electrode plate. The diaphragm 56 is stretched like a film on the lower surface of the silicon substrate 54 by being supported by anchors (not shown) at several positions of the outer peripheral edge. Among the anchors, a vent hole (a narrow gap) is formed between the outer peripheral edge of the diaphragm 56 and the lower surface of the silicon substrate 54.

A back plate 57 is provided below the diaphragm 56 such that an air gap 58 (a void) is formed between the back plate 57 and the diaphragm 56, and an outer peripheral portion of the back plate 57 is fixed to the lower surface of the silicon substrate 54. A fixed electrode plate 59 is provided on the upper surface of the back plate 57 so as to face the diaphragm 56. The back plate 57 is formed of insulating SiN, and the fixed electrode plate 59 is formed of conductive polysilicon. As a result, a capacitor for acoustic vibration detection is formed by the diaphragm 56 and the fixed electrode plate 59 that face each other across the air gap 58.

A large number of acoustic holes 60 (acoustic perforations) are provided to substantially the entire back plate 57 and fixed electrode plate 59 so as to allow acoustic vibration that has vibrated the diaphragm 56 to pass through.

An extraction wiring 61 extends from an end portion of the diaphragm 56. An electrode portion 62 embedded in the back plate 57 is electrically connected to an end portion of the extraction wiring 61. An extraction wiring 63 extends from an end portion of the fixed electrode plate 59. An electrode portion 64 embedded in the back plate 57 is electrically connected to an end portion of the extraction wiring 63. The lower surface of the electrode portion 62 is exposed at one of four corners of the lower surface of the acoustic sensor 51, and a bump 67 is provided on the lower surface of the electrode portion 62. The lower surface of the electrode portion 64 is exposed at another corner of the four corners of the lower surface of the acoustic sensor 51, and a bump 67 is provided on the lower surface of the electrode portion 64. Of the four corners of the lower surface of the acoustic sensor 51, dummy electrodes (not shown) are provided at corners where the electrode portions 62 and 64 are not provided. The dummy electrode is an electrode for mechanically fixing the lower surface of the acoustic sensor 51 by soldering or the like, and does not have an electrical function. The bump is also provided for the dummy electrode.

The interposer 52 has a structure as shown in FIGS. 4(A), 4(B), 5(A) and 5(B). The interposer 52 is formed of an insulating material, particularly, a semiconductor substrate, into a rectangular tube shape, and a cavity 70 vertically penetrates the interposer 52 to accommodate the signal processing circuit 53. A ventilation notch 71 (i.e., an acoustic transmission path) is formed in an upper portion of a wall surface of the interposer 52.

The interposer 52 includes a structure for electrically connecting the acoustic sensor 51 and the circuit board 43. That is, a penetrating electrode 65 (a conductor) is embedded in one of four corners of the interposer 52, and a pad portion 65*a* electrically connected to the penetrating electrode 65 is provided on the upper surface of the interposer 52, and a pad portion 65*b* electrically connected to the penetrating electrode 65 is provided on the lower surface thereof.

A penetrating electrode 66 (a conductor) is embedded in another corner of the four corners of the interposer 52, and a pad portion 66*a* electrically connected to the penetrating electrode 66 is provided on the upper surface of the interposer 52, and a pad portion 66*b* electrically connected to the penetrating electrode 66 is provided on the lower surface thereof. Moreover, of the four corners of the interposer 52, at corners where the penetrating electrodes 65 and 66 are not provided, dummy electrodes 72*a* are provided on the upper surface of the interposer 52, and dummy electrodes 72*b* are provided on the lower surface thereof. The dummy electrodes 72*a* and 72*b* are electrodes for mechanically connecting and fixing the interposer 52, and the dummy electrode 72*a* on the upper surface and the dummy electrode 72*b* on the lower surface are not electrically connected to each other.

The ventilation notch 71 is formed to an upper portion of the wall surface of the interposer 52 in FIGS. 4(A), 4(B), 5(A), and 5(B), but the ventilation notch 71 may be formed in a lower portion of the wall surface of the interposer 52. Also, a ventilation opening, as an acoustic transmission path, may be opened in the shape of a window in the wall surface of the interposer 52. However, the acoustic transmission path such as the ventilation notch or the ventilation opening is required to have a path sectional area large enough to transfer a dynamic pressure change caused by acoustic vibration.

The signal processing circuit 53 (ASIC) is a circuit for amplifying an acoustic detection signal output from the acoustic sensor 51, further converting the signal into a digital signal, and outputting the signal. An electrode portion 69 for inputting a signal from the acoustic sensor 51 and an electrode portion 69 for outputting a signal which has been signal-processed are provided on the lower surface of the signal processing circuit 53.

The microphone 41 is assembled in the following manner. The acoustic sensor 51 is placed on the interposer 52, and the bump 67 provided on the lower surface of the electrode portion 62 is joined to the upper surface (the pad portion 65*a*) of the penetrating electrode 65, and the bump 67 provided on the lower surface of the electrode portion 64 is joined to the upper surface (the pad portion 66*a*) of the penetrating electrode 66. Also, the bump 67 of the dummy electrode provided on the lower surface of the acoustic sensor 51 is joined to the dummy electrode 72*a* on the upper surface of the interposer 52. As a result, the acoustic sensor 51 is mechanically fixed to the upper surface of the interposer 52 by the bumps 67 at four positions. Moreover, the electrode portions 62 and 64 of the acoustic sensor 51 are electrically connected to the lower surface (the pad portions 65*b* and 66*b*) of the interposer 52 through the penetrating electrodes 65 and 66.

The pad portions 65*b* and 66*b*, and the dummy electrode 72*b* provided on the lower surface of the interposer 52 are each joined to the upper surface electrode pad 44*a* of the circuit board 43 by a conductive material 68 such as solder or a conductive adhesive. The electrode portion 69 of the signal processing circuit 53 is also joined to the upper surface electrode pad 44*b* of the circuit board 43 by the conductive material 68 such as solder or a conductive adhesive.

The cover 42 is placed on the upper surface of the circuit board 43 so as to cover the acoustic sensor 51, the interposer 52, and the signal processing circuit 53 which are mounted on the upper surface of the circuit board 43. At this time, the sound introduction hole 48 of the cover 42 is arranged so as to border the front chamber 55 of the acoustic sensor 51. The entire circumference of the upper surface of the acoustic sensor 51 (the upper surface of the silicon substrate 54) is bonded and sealed to the inner surface of the cover 42 by adhesive resin 50. The lower surface of the cover 42 is bonded to the upper surface of the circuit board 43 by a conductive adhesive, and the electromagnetic shield film 47 is electrically connected to a ground electrode of the circuit board 43.

When acoustic vibration enters the microphone 41 from the sound introduction hole 48, the acoustic vibration is guided into the front chamber 55 of the acoustic sensor 51. Since the acoustic vibration vibrates the diaphragm 56, capacitance of the capacitor formed from the diaphragm 56 and the fixed electrode plate 59 is changed, and this change in the capacitance is output as acoustic detection signals from the electrode portions 62 and 64.

The acoustic detection signals output from the acoustic sensor 51 are transmitted to the upper surface electrode pads 44*a* through the penetrating electrodes 65 and 66. The upper surface electrode pads 44*a* to which the pad portions 65*b* and 66*b* of the penetrating electrodes 65 and 66 are joined are electrically connected to the upper surface electrode pad 44*b* to which the electrode portion 69 for signal input of the signal processing circuit 53 is joined by a wiring pattern (not shown) provided on the upper surface or the inside of the circuit board 43. Accordingly, the acoustic detection signals of the acoustic sensor 51 are input from the electrode portion 69 for signal input to the signal processing circuit 53. The upper surface electrode pad 44*b* to which the electrode portion 69 for signal output is joined is connected to the lower surface electrode pad 45 of the circuit board 43 by a wiring structure (not shown) provided inside the circuit board 43. Accordingly, an output signal processed by the signal processing circuit 53 is output to the outside from the lower surface electrode pad 45 of the circuit board 43.

Note that, since the mode of electrical connection between the acoustic sensor 51 and the signal processing circuit 53, and the number of penetrating electrodes of the interposer 52 varies according to the structures of the acoustic sensor 51 and the signal processing circuit 53, the description above is only an example.

Figure 1:
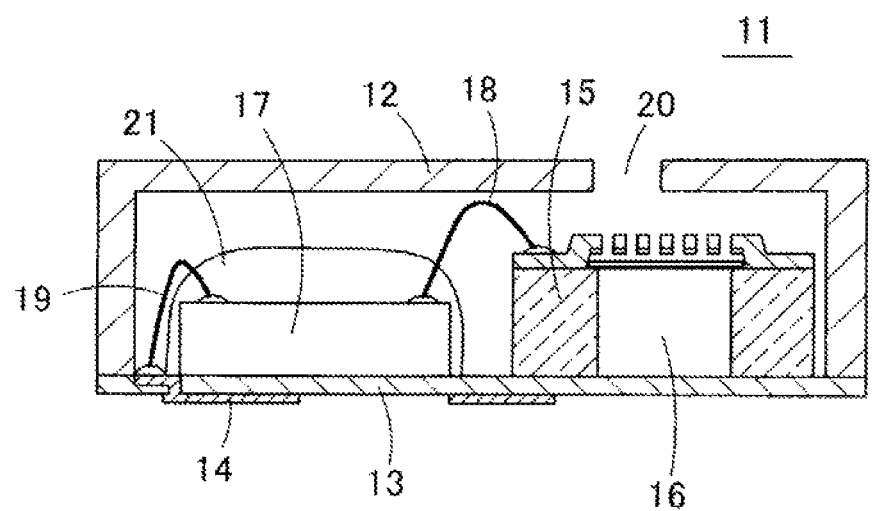
FIG. 1 is a cross-sectional view showing a microphone of a general structure.
Figure 2:
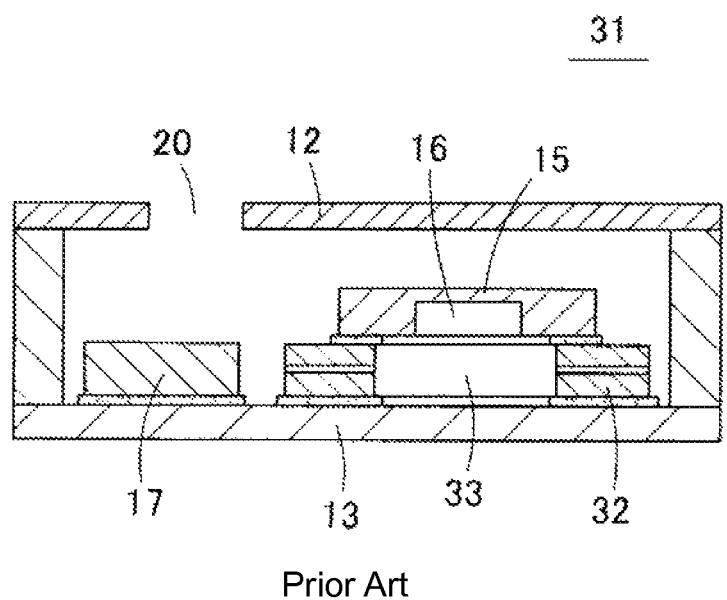
FIG. 2 is a cross-sectional view of a microphone disclosed in Patent Document 1.

The following effects can be achieved by the acoustic sensor 51 structured in the above manner. In the case of connecting the acoustic sensor and the signal processing circuit using a bonding wire (for example, see FIG. 1), the bonding wire may break due to vibration or the like if the bonding wire is tightly stretched. Also, if the bonding wire is arranged being slackened downward, the wire may come in contact with the electrode pad of the acoustic sensor or the signal processing circuit. Accordingly, the bonding wire is arranged being slackened upward. As a result, the height of the package is required to be high enough to accommodate the bonding wire protruding upward, and the height of the microphone is increased to that extent.

In contrast, in the acoustic sensor 51 of the present embodiment, the acoustic sensor 51 and the signal processing circuit 53 are connected through the penetrating electrodes 65 and 66 provided to the interposer 52. Accordingly, the slackening of the bonding wire does not have to be taken into account as in the case of using the bonding wire for connection, and the height of the acoustic sensor 51 is not unnecessarily increased.

Also, since the acoustic sensor 51 and the signal processing circuit 53 are vertically arranged, an area for mounting the signal processing circuit 53 may not be provided separately with the area for mounting the acoustic sensor 51. Thus, as compared to a conventional case of arranging the acoustic sensor 51 and the signal processing circuit 53 side by side, the plane area of the microphone 41 can be made significantly smaller. Therefore, even if the sizes of the acoustic sensor 51 and the signal processing circuit 53 cannot be made small, the microphone 41 can be miniaturized.

In the acoustic sensor 51, the space surrounded by the silicon substrate 54 between the sound introduction hole 48 and the diaphragm 56 forms the front chamber 55. On the other hand, the space on the side of the lower surface of the diaphragm 56 forms the back chamber of the acoustic sensor 51. However, acoustic vibration which has passed the diaphragm 56 can pass through the acoustic hole 60 and spread in the cavity 70 inside the interposer 52, and then, can further pass through the ventilation notch 71 and spread in an intra-package space 49. Here, of the space inside the package surrounded by the cover 42 and the circuit board 43, the intra-package space 49 is a space outside the acoustic sensor 51 and the interposer 52. Thus, in the acoustic sensor 51, the space inside the acoustic sensor 51 and below the diaphragm 56, the cavity 70 inside the interposer 52, and the intra-package space 49 substantially form the back chamber. That is, in the microphone 41, substantially all the space inside the package, except for the front chamber 55, forms the back chamber.

The sensitivity of the acoustic sensor 51 is improved as the capacity of the back chamber is increased. In the microphone 41, since a large part of the space inside the package can be used as the back chamber, the sensitivity of the acoustic sensor 51 can be improved.

Also, in the microphone 41 of the present embodiment, since the electromagnetic shield film 47 is formed on the inner surface of the cover 42 (the electromagnetic shield may also be provided inside the circuit board 43), the acoustic sensor 51 and the signal processing circuit 53 can be shut off from external noise, and the S/N ratio of the microphone 41 can be improved.

(Method for Manufacturing Microphone of First Embodiment)

Figure 7:
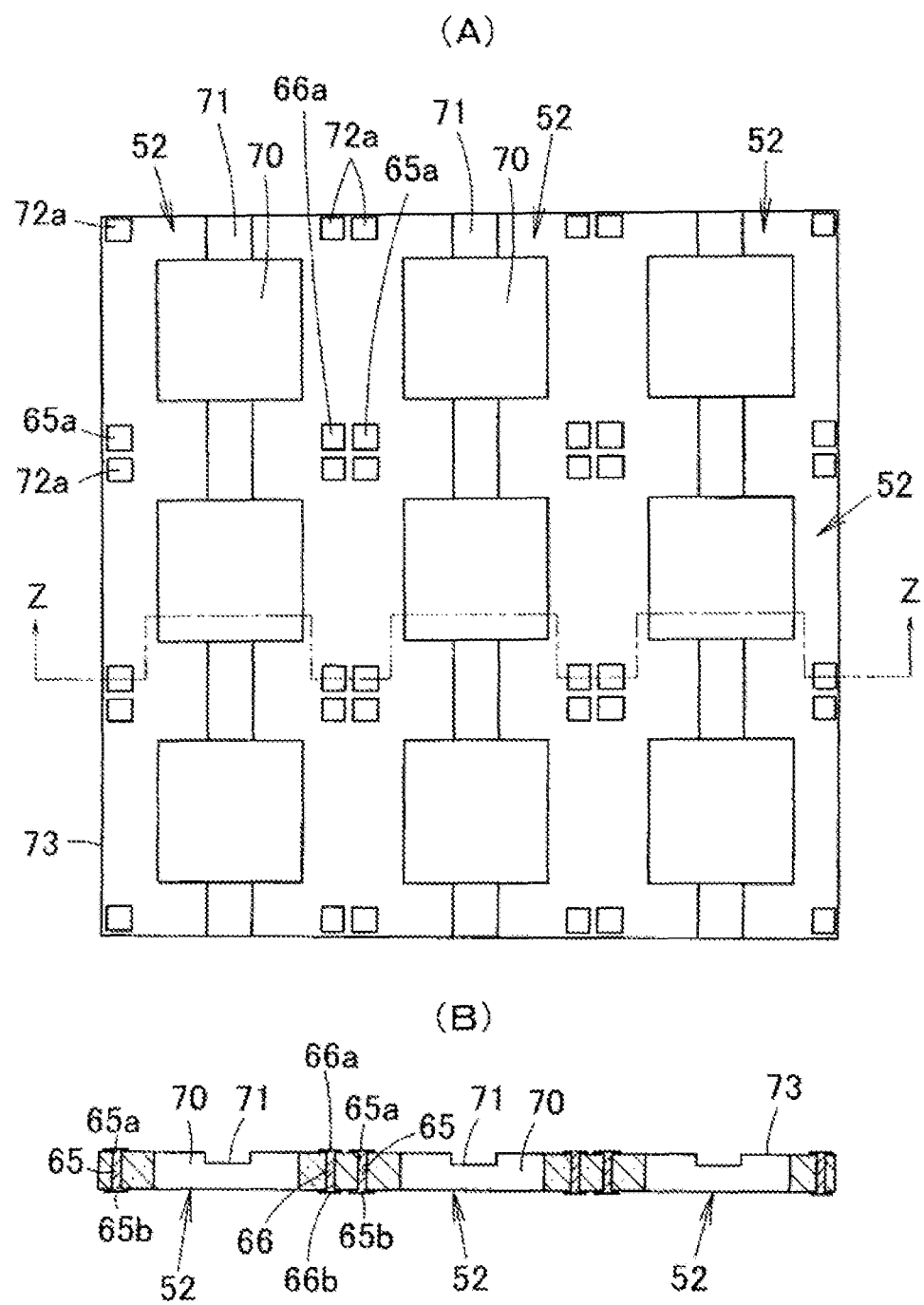
FIG. 7(A) is a plan view showing a plurality of microphones that are integrally fabricated by the process of FIGS. 6(A) to 6(F).
FIG. 7(B) is a cross-sectional view taken along line Z-Z in FIG. 7(A).
Figure 8:
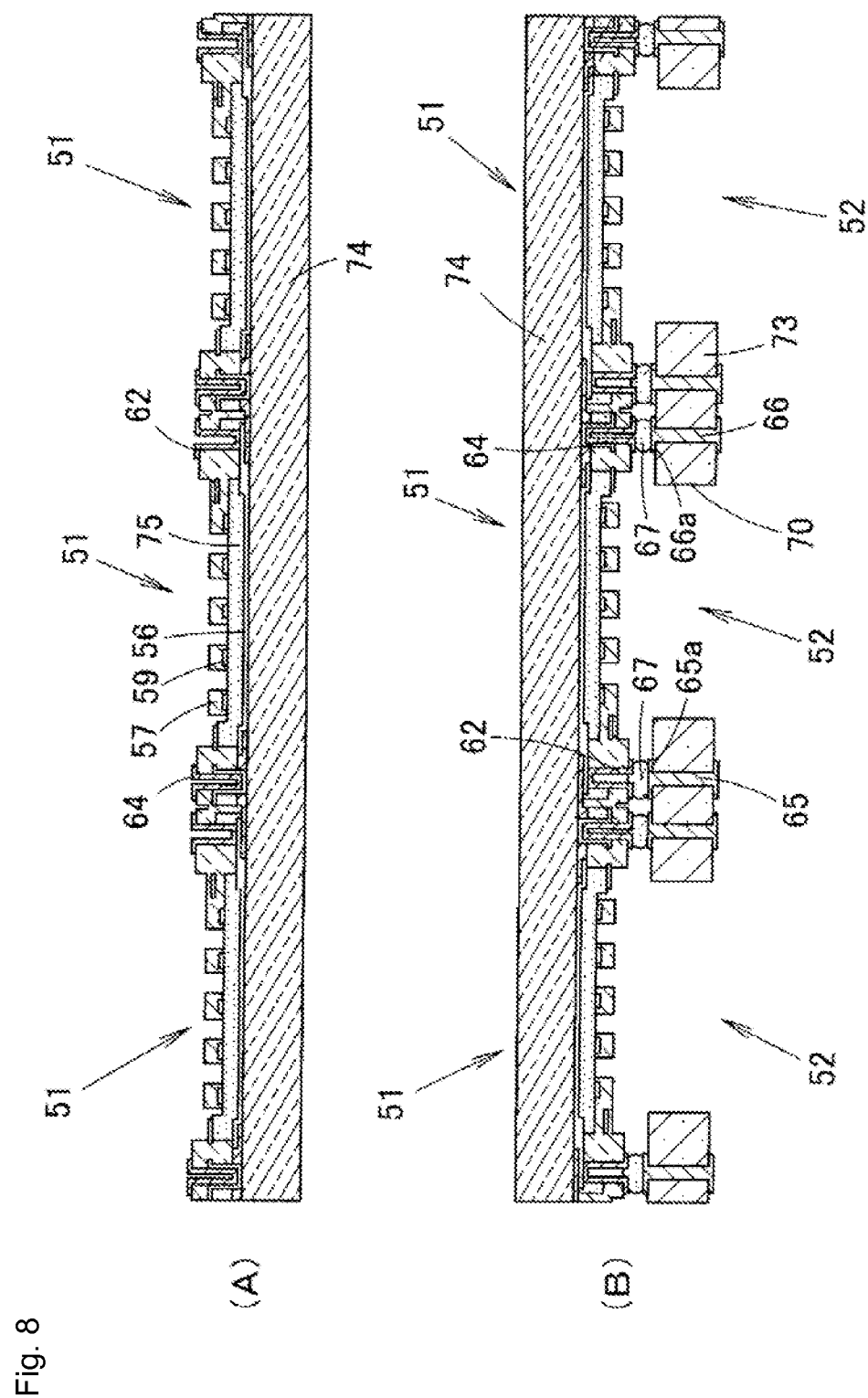
FIG. 8(A) is cross-sectional view of a part of a manufacturing process of a microphone, showing a state where a plurality of acoustic sensors has been fabricated at one time.
FIG. 8(B) is a cross-sectional view showing a state where the acoustic sensors in FIG. 8(A) are vertically inverted and joined integrally on the interposer in FIG. 7.
Figure 9:
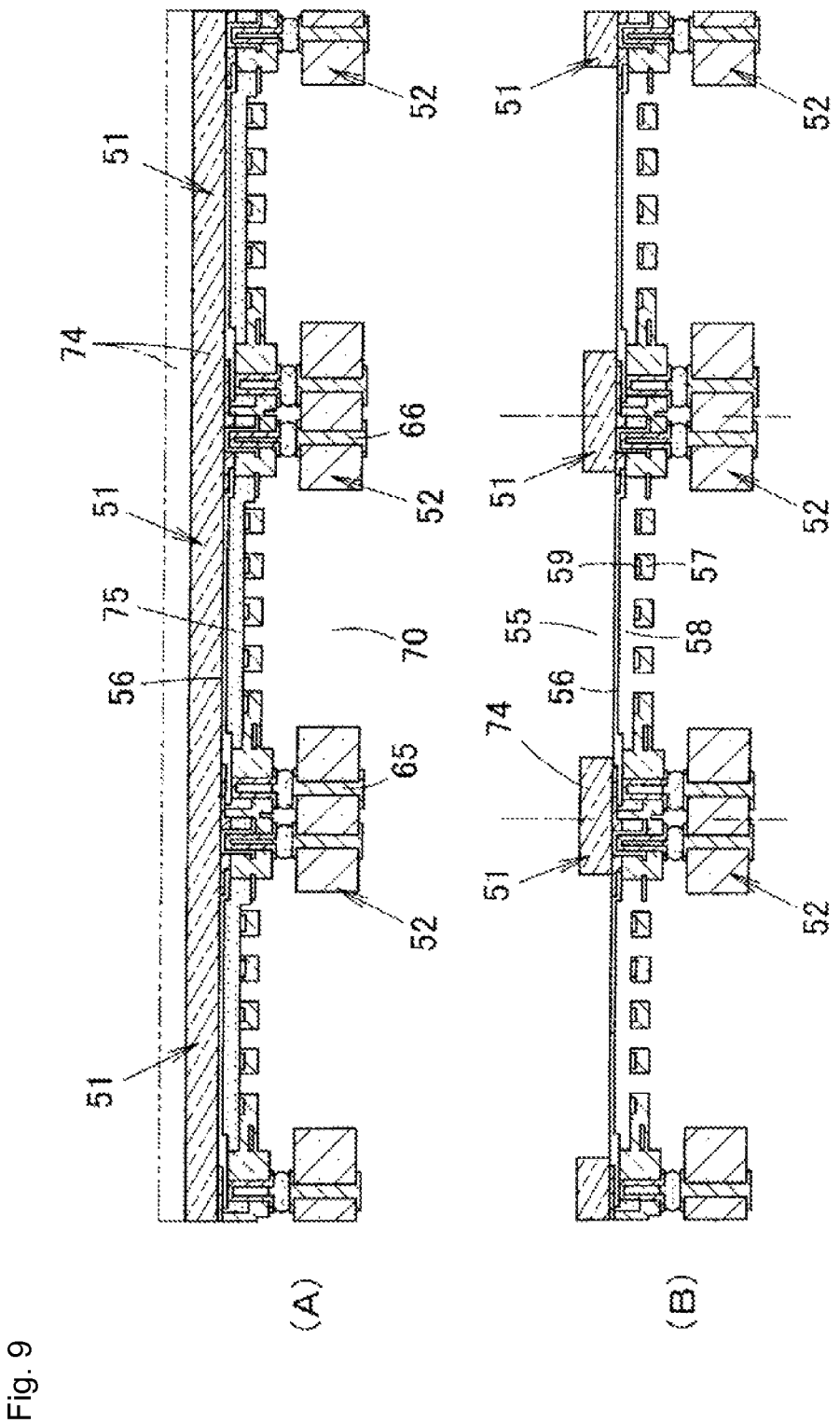
FIG. 9(A) is a cross-sectional view for describing a process of polishing and thinning an Si wafer of an acoustic sensor.
FIG. 9(B) is a cross-sectional view showing a state where a front chamber is opened in the Si wafer of the acoustic sensor, and a sacrifice layer is etched and removed.
Figure 10:
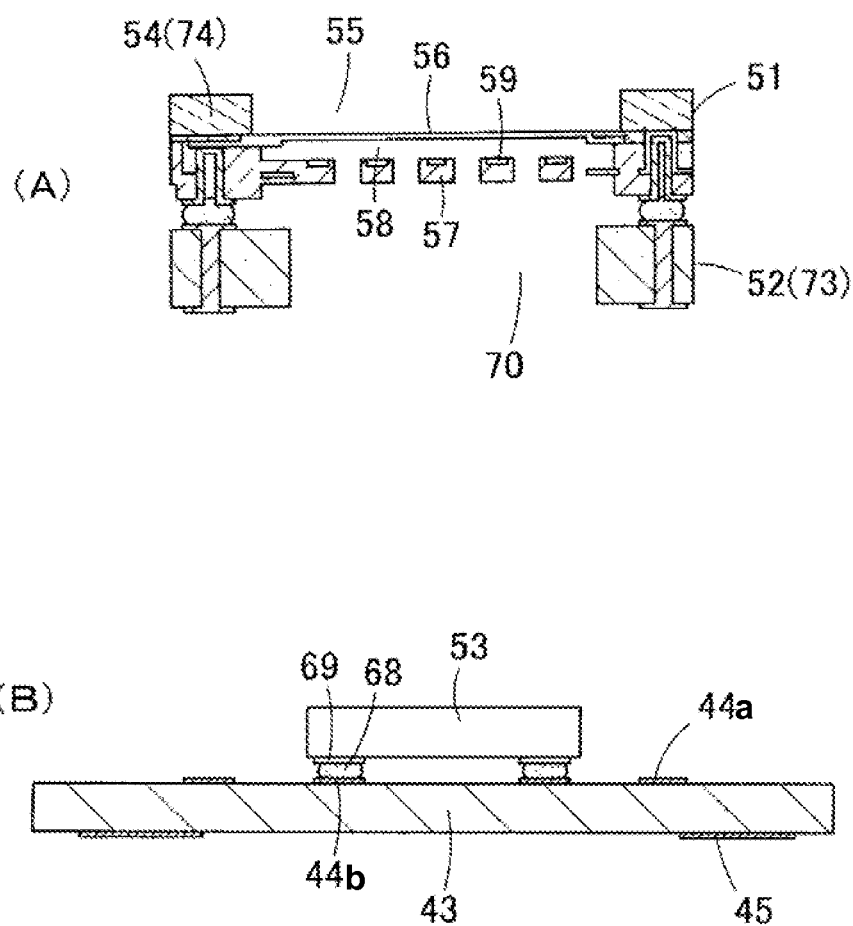
FIG. 10(A) is a cross-sectional view showing an interposer and one acoustic sensor obtained by division by dicing.
FIG. 10(B) is a cross-sectional view for describing a process of mounting a signal processing circuit on an upper surface of a circuit board.
Figure 11:
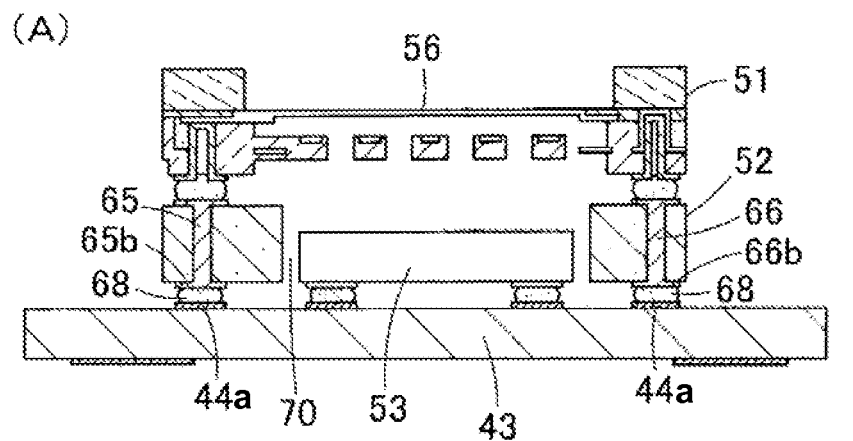
FIG. 11(A) is a cross-sectional view showing a state where an acoustic sensor and an interposer are mounted on a circuit board so as to cover a signal processing circuit.
FIG. 11(B) is a cross-sectional view showing a state where a cover is attached to an upper surface of the circuit board.
Figure 11:
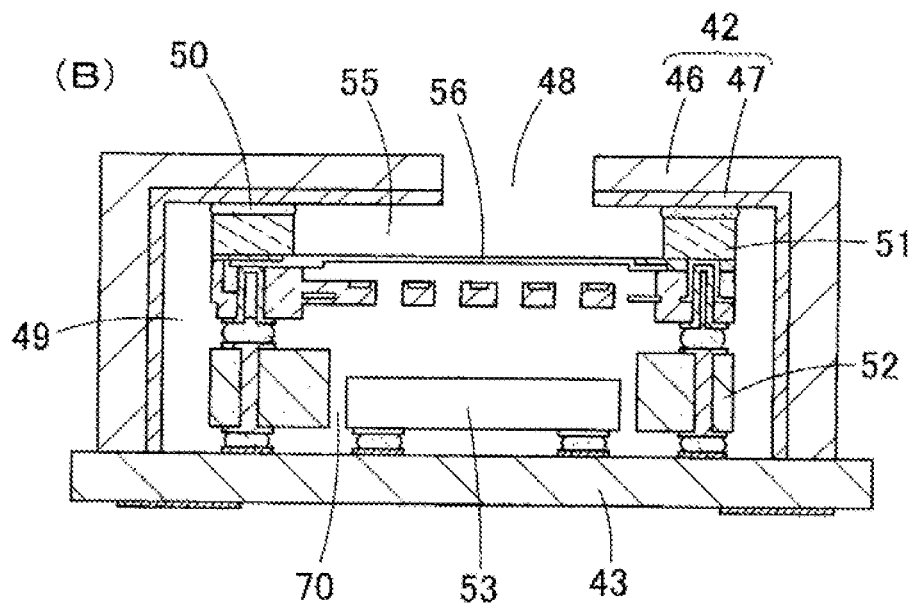

Next, a process of manufacturing the microphone 41 of the first embodiment will be described based on FIGS. 6(A) to 11(B). A plurality of interposers 52 are fabricated at one time by the process as shown in FIGS. 6(A) to 6(F). FIG. 7(A) is a plan view showing the plurality of interposers 52 that are integrally fabricated as a result. FIG. 7(B) shows a cross section along line Z-Z in FIG. 7(A). The plurality of interposers 52 are fabricated in the following manner.

FIG. 6(A) shows an insulating Si wafer 73 used for fabricating a plurality of interposers 52 at one time. A thin metal film is formed on the lower surface of the Si wafer 73, and the thin metal film is subjected to patterning by photolithography or the like. As a result, as shown in FIG. 6(B), the pad portions 65b, 66b, and 72b (not shown) are formed at respective predetermined positions on the lower surface of the Si wafer 73.

Then, as shown in FIG. 6(C), through-holes 76 are opened above the pad portions 65b and 66b by etching the Si wafer 73. The through-holes 76 are filled with a metal material by coating or the like, and as shown in FIG. 6(D), the penetrating electrodes 65 and 66 are formed inside the through-holes 76. The penetrating electrode 65 is formed on the pad portion 65b, and is electrically connected to the pad portion 65b. Similarly, the penetrating electrode 66 is formed on the pad portion 66b, and is electrically connected to the pad portion 66b. Moreover, a thin metal film is formed on the upper surface of the Si wafer 73, and the thin metal film is subjected to patterning by photolithography or the like. As a result, as shown in FIG. 6(E), the pad portion 65b electrically connected to the penetrating electrode 65 is formed on the penetrating electrode 65, and the pad portion 66b electrically connected to the penetrating electrode 66 is formed on the penetrating electrode 66. Moreover, on the upper surface of the Si wafer 73, the dummy electrode 72a is formed at a position facing the dummy electrode 72b. Then, a center portion of a region surrounded by a set of pad portions 65a and 66a and the dummy electrode 72a (not shown) is etched, and as shown in FIG. 6(F), the vertically penetrating cavity 70 is opened. Lastly, the ventilation notch 71 is formed by etching the upper surface of the Si wafer 73 in the shape of a groove, and a plurality of interposers 52 that are integrated are fabricated. A plurality of interposers 52 are thus fabricated, as shown in FIGS. 7(A) and 7(B).

A plurality of acoustic sensors 51 are also fabricated at one time. FIG. 8(A) is a cross-sectional view showing a plurality of acoustic sensors 51 which have been fabricated at one time. The polysilicon diaphragm 56 is provided on the upper surface of an Si wafer 74 (a plate), at each region which is to be the acoustic sensor 51. A sacrifice layer 75 is formed on the diaphragm 56, and the fixed electrode plate 59 and the back plate 57 are provided on the upper surface of the sacrifice layer 75. The electrode portions 62 and 64 and dummy electrodes are provided at corners of the region which is to be the acoustic sensor 51.

As shown in FIG. 8(B), the acoustic sensor 51 fabricated as shown in FIG. 8(A) is vertically inverted and stacked on the upper surface of the interposer 52 in FIG. 7, and the electrode portion 62 and the pad portion 65a, the electrode portion 64 and the pad portion 66a, and the dummy electrode and the dummy electrode 72a are joined by the bumps 67. As a result, the Si wafer 74 on which a plurality of acoustic sensors 51 are arranged, and the Si wafer 73 on which a plurality of interposers 52 are arranged are integrally bonded to each other.

Next, as shown in FIG. 9(A), the upper surface of the acoustic sensor 51 is polished, and the thickness of the Si wafer 74 is reduced. Since the wafer is thin and is substantially disc-shaped with a large diameter, its rigidity is not very high. Accordingly, if the Si wafer 74 where the acoustic sensor 51 is formed is singly polished to reduce the thickness of the Si wafer 74, the Si wafer 74 may be cracked or chipped in the polishing process or in a subsequent process, and the yield of the acoustic sensor 51 is reduced. However, according to the manufacturing method described here, since two Si wafers, i.e., the Si wafer 73 and the Si wafer 74, are bonded together, the rigidity of the wafer can be increased. Accordingly, by performing polishing after bonding the Si wafer 74 and the Si wafer 73 together, polishing can be performed while increasing the rigidity of the Si wafer 74, and the Si wafer 74 can be polished easily while achieving a high yield.

Subsequently, as shown in FIG. 9(B), the sacrifice layer 75 of the acoustic sensor 51 is removed by etching, and the air gap 58 is formed between the diaphragm 56 and the fixed electrode plate 59. As a result, the diaphragm 56 is formed into a film capable of vibrating. Then, the Si wafers 74 and 73 are diced along a cutting line shown by a dashed line in FIG. 9(B). As a result, as shown in FIG. 10(A), the acoustic sensors 51 and the interposers 52 are separated one by one while being vertically joined.

Next, the signal processing circuit 53 is flip-chip mounted on the upper surface of the circuit board 43, and the electrode portion 69 of the signal processing circuit 53 is joined to the upper surface electrode pad 44$b$ of the circuit board 43 by the conductive material 68. The signal processing circuit 53 mounted on the circuit board 43 in this manner is shown in FIG. 10(B).

Next, as shown in FIG. 11(A), the interposer 52 and the acoustic sensor 51 that are integrated are overlapped on the circuit board 43 to cover the signal processing circuit 53, and the signal processing circuit 53 is accommodated in the cavity 70 of the interposer 52. At this time, the pad portions 65$b$ and 66$b$ and the dummy electrode 72$b$ of the interposer 52 are each joined to the upper surface electrode pad 44$a$ of the circuit board 43 by the conductive material 68.

Subsequently, as shown in FIG. 11(B), the cover 42 is overlapped on the circuit board 43 so as to cover the acoustic sensor 51, the interposer 52, and the signal processing circuit 53. The sound introduction hole 48 is opened in the cover 42 in advance, and the sound introduction hole 48 overlaps the upper surface opening of the front chamber 55 when the cover 42 is overlapped on the circuit board 43. Then, the lower surface of the cover 42 is joined to the circuit board 43 by a conductive adhesive. At this time, the upper surface of the acoustic sensor 51 is bonded to the inner surface of the cover 42 by the adhesive resin 50, and the entire circumference of the upper surface of the acoustic sensor 51 and the entire circumference of the sound introduction hole 48 on the inside of the cover 42 are sealed, and the acoustic vibration entering from the sound introduction hole 48 is prevented from leaking from the gap between the acoustic sensor 51 and the cover 42.

When the microphone 41 is manufactured in this manner, the Si wafer 74 is unlikely to be cracked or chipped at the time of polishing of the Si wafer 74, and the yield in the manufacturing process of the microphone 41 is increased. Also, since the Si wafer 74 is not easily cracked or chipped, the thickness of the Si wafer 74 can be reduced by polishing, and the height of the acoustic sensor 51 can be reduced. If it is possible to reduce the height of the acoustic sensor 51, the cover 42 with a small height can be used, and the microphone 41 can be reduced in height and size.

Second Embodiment

Figure 12:
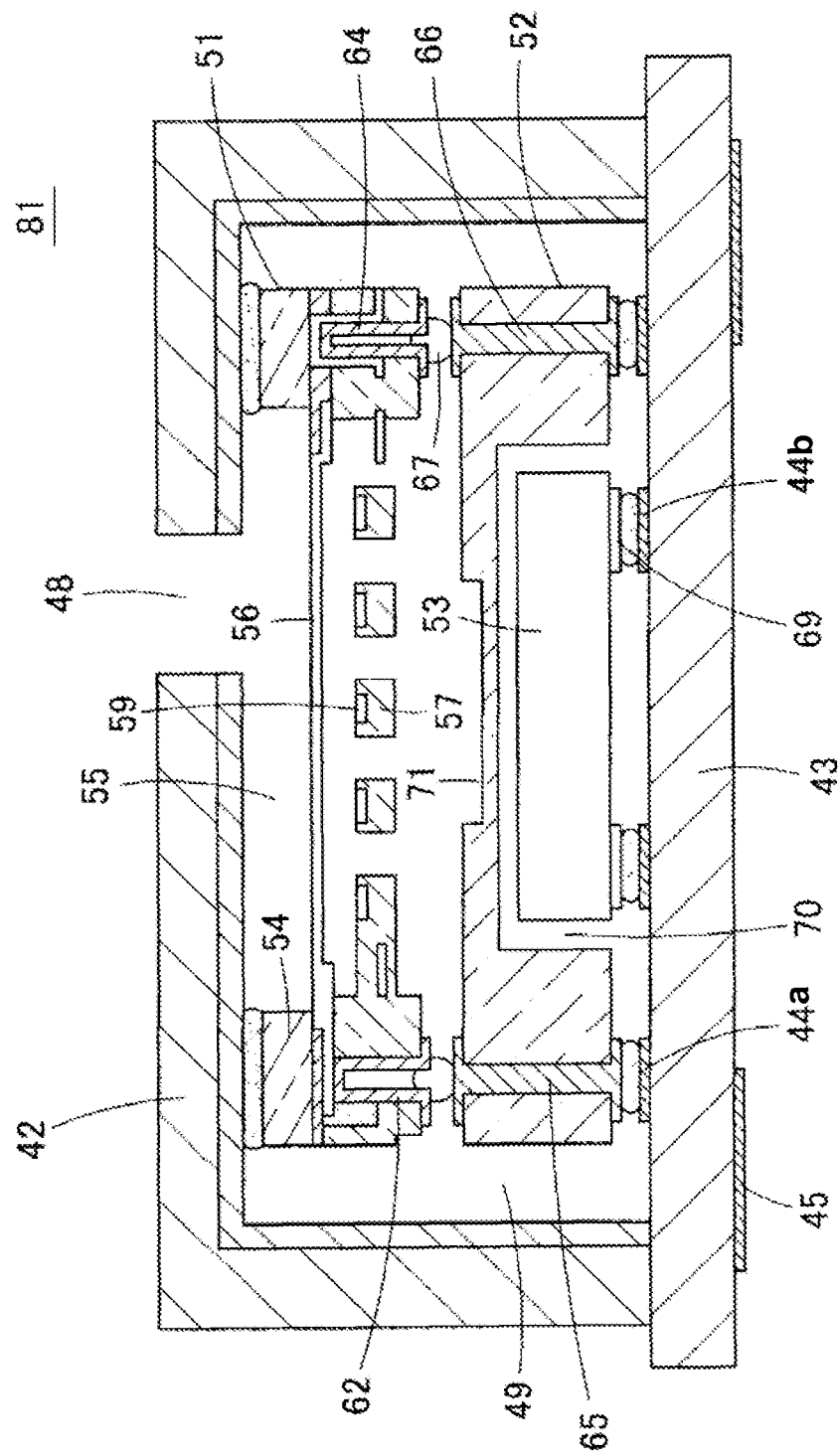
FIG. 12 is a cross-sectional view showing a structure of a microphone according to a second embodiment of the present invention.

FIG. 12 is a cross-sectional view showing a microphone 81 according to a second embodiment of the present invention. The microphone 81 is different from the microphone 41 of the first embodiment only in the form of the interposer 52. Accordingly, with respect to the microphone 81 of the second embodiment, description of other than the interposer 52 is omitted.

Figure 13:
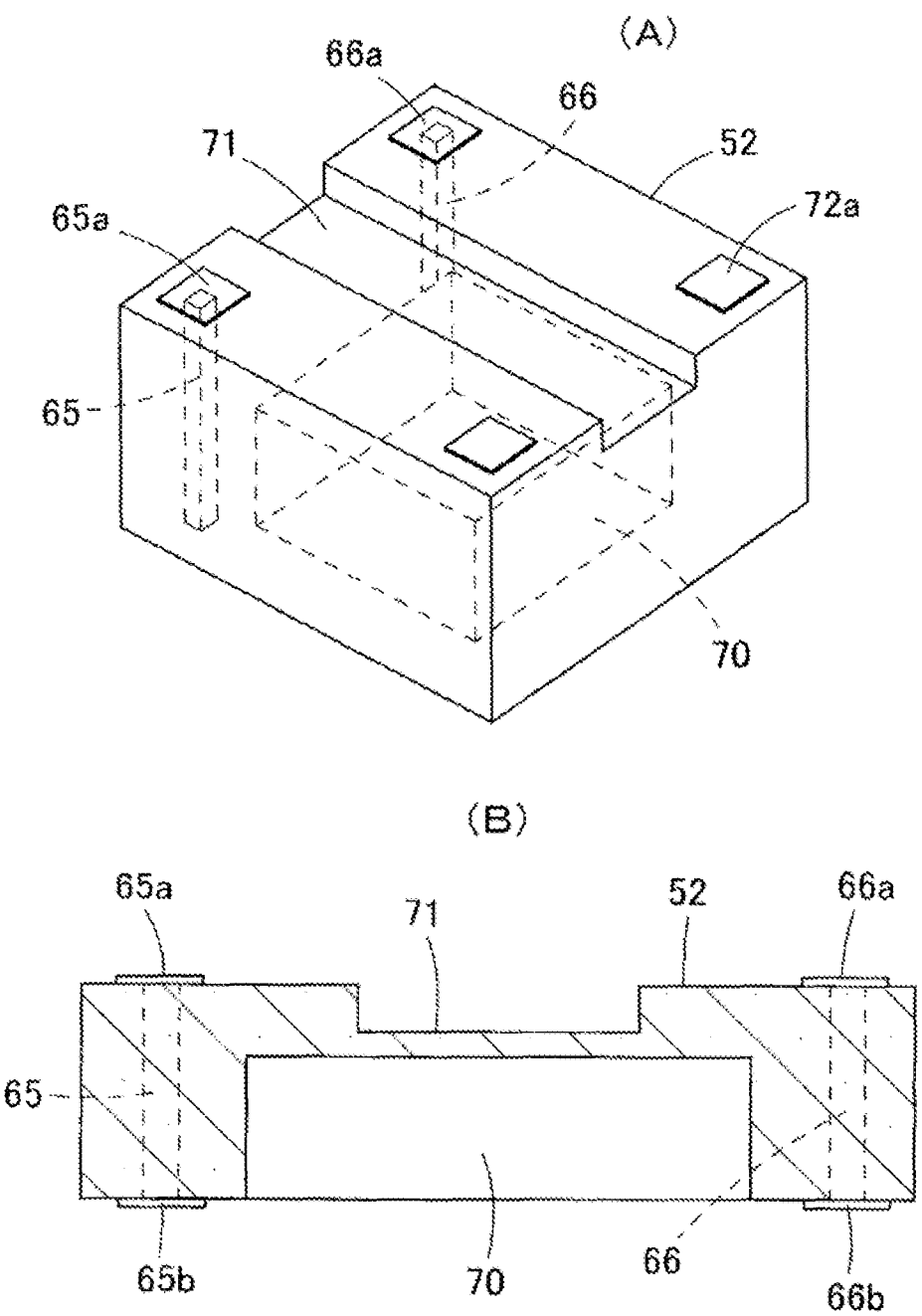
FIGS. 13(A) and 13(B) are perspective view and a cross-sectional view of an interposer used for the microphone of the second embodiment.

As shown in FIGS. 13(A) and 13(B), in the interposer 52 used for the microphone 81, the cavity 70 for accommodating the signal processing circuit 53 is formed into a box shape which is open on the bottom and which is closed on the top. On the other hand, one or more groove-shaped ventilation notches 71 are provided on the upper surface of the interposer 52.

Accordingly, the space (the back chamber) below the diaphragm 56 of the acoustic sensor 51 communicates with the intra-package space 49 through the ventilation notch 71, and not through the cavity 70 for accommodating the signal processing circuit 53. Accordingly, the capacity of the back chamber can be substantially increased, and the sensitivity of the microphone 81 can be improved.

In the microphone 81, the cavity 70 of the interposer 52 is a space for accommodating the signal processing circuit 53. Furthermore, the acoustic sensor 51 and the signal processing circuit 53 being vertically arranged are partitioned by the interposer 52, and short-circuiting or the like between the acoustic sensor 51 and the signal processing circuit 53 can be prevented. Moreover, since the signal processing circuit 53 is covered by the interposer 52, the signal processing circuit 53 can be protected from moisture and dust entering from the sound introduction hole 48.

The microphone 81 of the second embodiment as described above can be manufactured in the same manner as the manufacturing method described in the first embodiment, and the height of the microphone 81 can be reduced.

Third Embodiment

Figure 14:
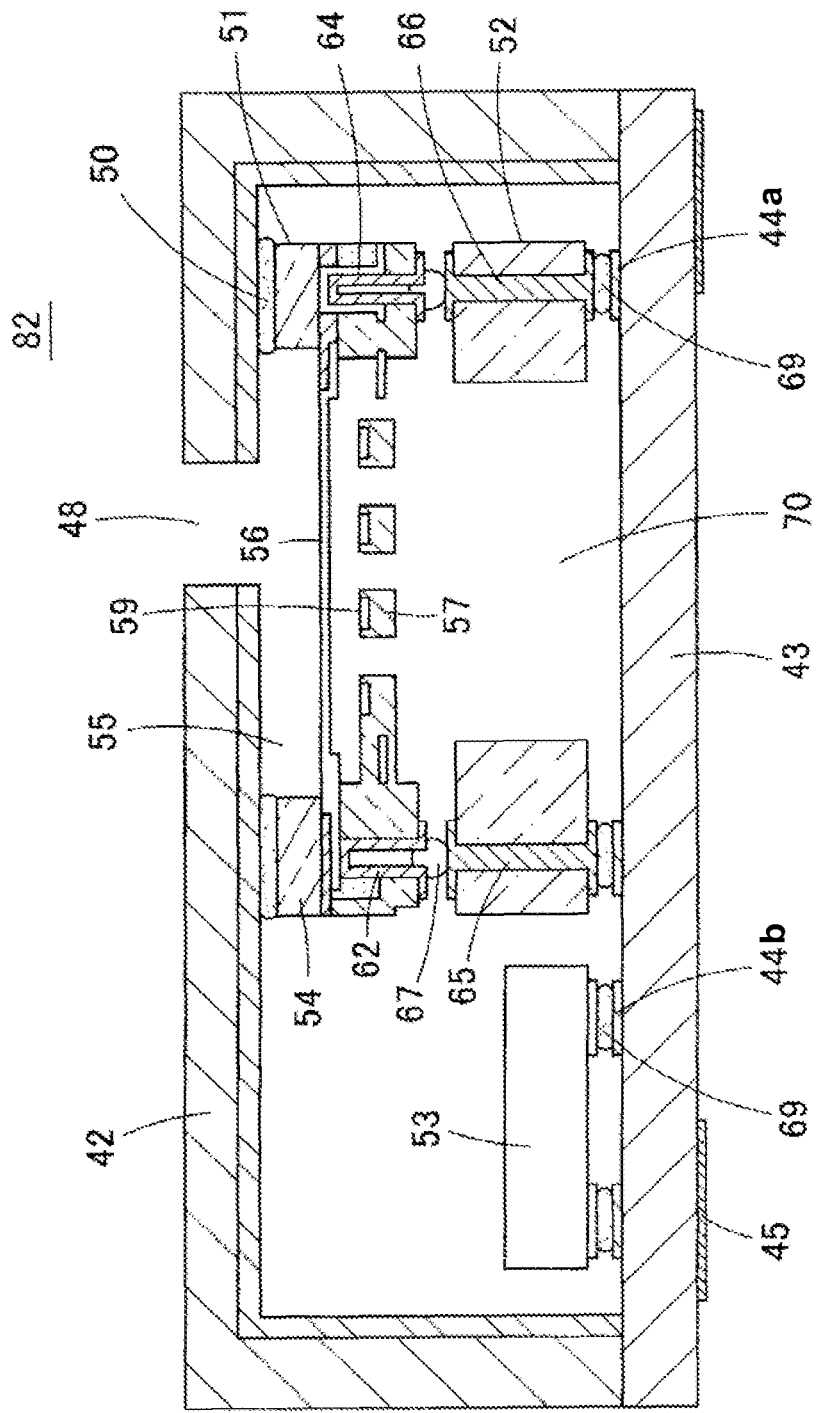
FIG. 14 is a cross-sectional view showing a structure of a microphone according to a third embodiment of the present invention.

FIG. 14 is a cross-sectional view showing a microphone 82 according to a third embodiment of the present invention. In the microphone 82, the signal processing circuit 53 is not placed inside the interposer 52. The signal processing circuit 53 is mounted on the upper surface of the circuit board 43, next to the interposer 52. Accordingly, in the microphone 82, the cavity 70 inside the interposer 52 communicates with the back chamber of the acoustic sensor 51, and serves to increase the capacity of the back chamber.

The microphone 82 of the third embodiment as described above may be manufactured in the same manner as the manufacturing method described in the first embodiment, and the height of the microphone 82 can be reduced.

Figure 15:
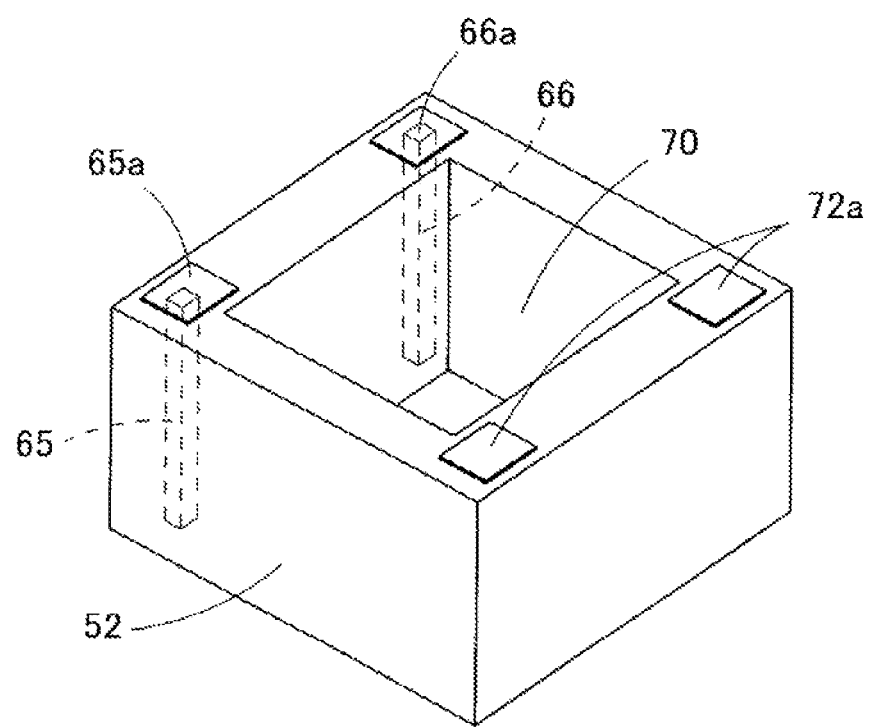
FIG. 15 is a perspective view of an interposer used for the microphone of the third embodiment.

Furthermore, the interposer 52 does not necessarily include an acoustic transmission path such as the ventilation notch 71. The interposer 52 as shown in FIG. 15 that does not include the ventilation notch 71 may also be used. In this case, the back chamber is extended only to the cavity 70 inside the interposer 52, and the intra-package space 49 cannot be used as the back chamber. However, an acoustic transmission path such as the ventilation notch 71 to the interposer 52 may not be provided to the manufacturing method of the present invention.

Other Embodiments

Figure 16:
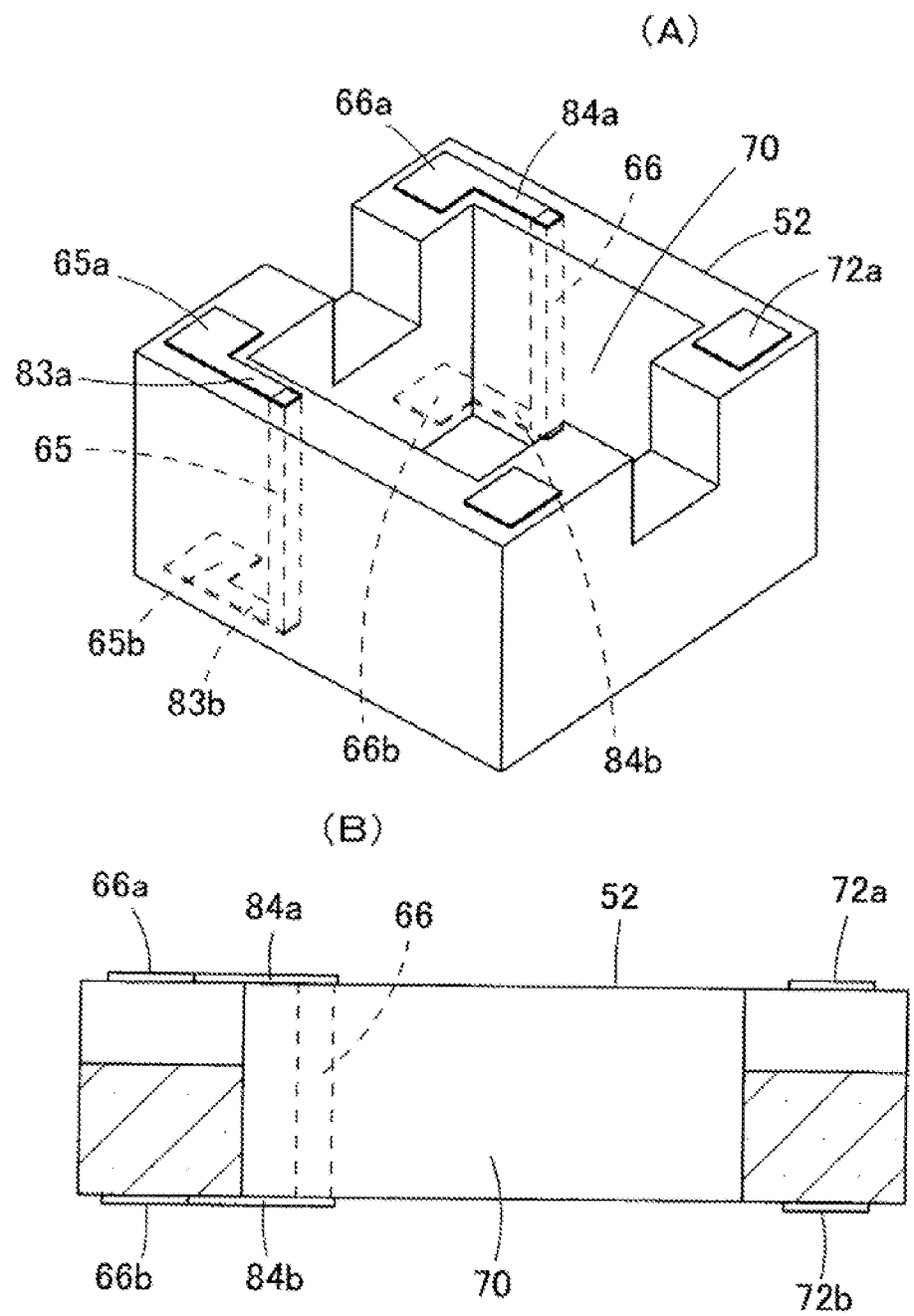
FIG. 16(A) is a perspective view showing an interposer of a different embodiment.
FIG. 16(B) is a cross-sectional view thereof.

The interposer 52 may have various structures other than the structures described in the first and second embodiments. FIGS. 16(A) and 16(B) show yet another embodiment. In the interposer 52, an extended electrode portion 83$a$ is extended from the pad portion 65$a$ along the upper surface of the interposer 52, an extended electrode portion 83$b$ is extended from the pad portion 65$b$ along the lower surface of the interposer 52, and a tip end portion of the extended electrode portion 83$a$ and a tip end portion of the extended electrode portion 83$b$ are connected by the penetrating electrode 65. Similarly, an extended electrode portion 84$a$ is extended from the pad portion 66$a$ along the upper surface of the interposer 52, and an extended electrode portion 84$b$ is extended from the pad portion 66$b$ along the lower surface of the interposer 52, and a tip end portion of the extended electrode portion 84$a$ and a tip end portion of the extended electrode portion 84$b$ are connected by the penetrating electrode 66. According to this embodiment, the positions where the penetrating electrodes 65 and 66 are to be provided are not restricted.

Disclosed is a method for manufacturing a semiconductor device, the method comprising: fabricating a semiconductor element on a semiconductor substrate; joining a surface of the semiconductor substrate to a support member, the surface being on a side where the semiconductor element is fabricated; and polishing a surface on an opposite side of the surface of the semiconductor substrate where the semiconductor element is fabricated and reducing a thickness of the semiconductor substrate, in a state where the semiconductor substrate and the support member are joined.

With the method for manufacturing a semiconductor device according to at least one embodiment of the present invention, the semiconductor substrate on which the semiconductor element is fabricated is bonded to the support member, and then, the semiconductor substrate is polished and the thickness of the semiconductor substrate is reduced in a state where the semiconductor substrate and the support member are joined together. Accordingly, the height of the semiconductor element fabricated on the semiconductor substrate can be reduced, and the height of the semiconductor device can be reduced. Moreover, the semiconductor substrate can be polished in a state where the rigidity of the semiconductor substrate has been increased by bonding the semiconductor substrate and the support member together. Thus, the semiconductor substrate is not easily cracked or chipped in the polishing process or a process subsequent to the polishing, and the yield of the semiconductor element can be increased, and also, the height of the semiconductor device can be substantially reduced.

With the method for manufacturing a semiconductor device according to one embodiment of the present invention, the support member may be mounted on a circuit board, and a conductor for electrically connecting the semiconductor element and the circuit board may vertically penetrate the support member. According to such an embodiment, the height of the semiconductor device can be reduced compared to a case of using a bonding wire to connect the semiconductor element to the circuit board.

With the method for manufacturing a semiconductor device according to another embodiment of the present invention, the semiconductor substrate may be a wafer on which a plurality of the semiconductor elements are fabricated, and a plurality of the support members may be formed by another wafer. According to such an embodiment, a plurality of semiconductor elements and support members may be fabricated at one time, and the manufacturing efficiency of the semiconductor device is improved. Also, in this case, thin wafers with large diameters are used for the semiconductor substrate and the support member, but even in this case, according to the method of the present invention, the wafers are not easily cracked or chipped due to polishing. The usefulness of the present invention is thus further increased.

Disclosed is a method for manufacturing a microphone, the method comprising: fabricating an acoustic sensor on a semiconductor substrate; forming a cavity in a plate and fabricating a support member; joining a surface of the semiconductor substrate to the support member, the surface being on a side where the acoustic sensor is fabricated; polishing a surface on an opposite side of the surface of the semiconductor substrate where the acoustic sensor is fabricated and reducing a thickness of the semiconductor substrate, in a state where the semiconductor substrate and the support member are joined; and mounting the acoustic sensor formed on the semiconductor substrate after a polishing process, the support member, and a signal processing circuit inside a package.

With the method for manufacturing a microphone according to at least one embodiment of the present invention, the semiconductor substrate on which the acoustic sensor is fabricated is bonded to the plate which is the support member, and then, the semiconductor substrate is polished and the thickness of the semiconductor substrate is reduced in a state where the semiconductor substrate and the support member are joined together. Accordingly, the height of the acoustic sensor fabricated on the semiconductor substrate can be reduced, and the height of the microphone can be reduced. Moreover, the semiconductor substrate can be polished in a state where the rigidity of the semiconductor substrate has been increased by bonding together the semiconductor substrate and the support member. Thus, the semiconductor substrate is not easily cracked or chipped in the polishing process or a process subsequent to the polishing, and the yield of the acoustic sensor can be increased, and also, the height of the acoustic sensor can be substantially reduced.

With the method for manufacturing a microphone according to one embodiment of the present invention, the cavity may be a space for accommodating the signal processing circuit. According to such an embodiment, the plane area of the microphone can be made smaller by accommodating the signal processing circuit in the cavity of the support member, and the microphone can be miniaturized.

With the method for manufacturing a microphone according to another embodiment of the present invention, the cavity may be a space that communicates with a back chamber of the acoustic sensor. According to such an embodiment, the capacity of the back chamber of the acoustic sensor can be substantially increased, and the sensitivity of the acoustic sensor is improved.

With the method for manufacturing a microphone according to yet another embodiment of the present invention, a conductor for electrically connecting the acoustic sensor and an electrode pad provided to the package may vertically penetrate the support member. According to such an embodiment, the height of the microphone can be reduced compared to a case of using a bonding wire to connect the acoustic sensor to the package.

With the method for manufacturing a microphone according to still another embodiment of the present invention, the plate is another semiconductor substrate. If the semiconductor substrate is used as the plate of the support member, the support member can be processed using an MEMS technique or photolithography in the same manner as the acoustic sensor.

With the method for manufacturing a microphone according to yet another embodiment of the present invention, the semiconductor substrate is a wafer on which a plurality of the acoustic sensors are fabricated, and the plate is a wafer on which a plurality of the support members are fabricated. According to such an embodiment, a plurality of acoustic sensors and support members can be fabricated at one time, and the manufacturing efficiency of the microphone is improved. Also, in this case, thin wafers with large diameters are used for the semiconductor substrate and the plate, but even in this case, according to the method of the present invention, the wafers are not easily cracked or chipped due to polishing. The usefulness of the present invention is thus further increased.

Note that the means for solving the problems according to the present invention has features where the structural elements described above are combined as appropriate, and the present invention allows a large number of variations by combination of such structural elements.

The invention claimed is:

1. A method for manufacturing a semiconductor device, the method comprising:
fabricating a semiconductor element on a semiconductor substrate;
joining a surface of the semiconductor substrate to a support member, the surface being on a side where the semiconductor element is fabricated; and
polishing a surface on an opposite side of the surface of the semiconductor substrate where the semiconductor element is fabricated and reducing a thickness of the semiconductor substrate, in a state where the semiconductor substrate and the support member are joined,
wherein the support member is mounted on a circuit board, and
a conductor for electrically connecting the semiconductor element and the circuit board vertically penetrates the support member.

2. The method for manufacturing a semiconductor device according to claim 1, wherein
the semiconductor substrate is a wafer on which a plurality of the semiconductor elements are fabricated, and a plurality of the support members are formed by another wafer.

3. A method for manufacturing a microphone, the method comprising:
fabricating an acoustic sensor on a semiconductor substrate;
fabricating a support member by forming a cavity in a plate;
joining a surface of the semiconductor substrate to the support member, the surface being on a side where the acoustic sensor is fabricated;
polishing a surface on an opposite side of the surface of the semiconductor substrate where the acoustic sensor is fabricated and reducing a thickness of the semiconductor substrate, in a state where the semiconductor substrate and the support member are joined; and
mounting the acoustic sensor formed on the semiconductor substrate after a polishing process, the support member, and a signal processing circuit inside a package.

4. The method for manufacturing a microphone according to claim 3, wherein
the cavity is a space for accommodating the signal processing circuit.

5. The method for manufacturing a microphone according to claim 3, wherein
the cavity is a space that communicates with a back chamber of the acoustic sensor.

6. The method for manufacturing a microphone according to claim 3, wherein
a conductor for electrically connecting the acoustic sensor and an electrode pad provided to the package vertically penetrates the support member.

7. The method for manufacturing a microphone according to claim 3, wherein
the plate is another semiconductor substrate.

8. The method for manufacturing a microphone according to claim 3, wherein
the semiconductor substrate is a wafer on which a plurality of the acoustic sensors are fabricated, and the plate is a wafer on which a plurality of the support members are fabricated.

* * * * *